(12) United States Patent
Mundschau et al.

(10) Patent No.: US 8,489,832 B1
(45) Date of Patent: Jul. 16, 2013

(54) SYSTEM AND METHOD FOR DUPLICATING ELECTRONICALLY STORED DATA

(75) Inventors: Steven T. Mundschau, Waukesha, WI (US); Paul Pelzl, Waukesha, WI (US); Robert Botchek, Brookfield, WI (US)

(73) Assignee: Guidance-Tableau, LLC, Pasadena, CA (US)

( * ) Notice: Subject to any disclaimer, the term of this patent is extended or adjusted under 35 U.S.C. 154(b) by 825 days.

(21) Appl. No.: 12/634,761

(22) Filed: Dec. 10, 2009

(51) Int. Cl.
*G06F 12/00* (2006.01)

(52) U.S. Cl.
USPC .......................................................... 711/162

(58) Field of Classification Search
None
See application file for complete search history.

(56) References Cited

U.S. PATENT DOCUMENTS

| 6,008,743 | A | * | 12/1999 | Jaquette | 341/51 |
| 7,650,040 | B2 | * | 1/2010 | Ghildiyal | 382/249 |
| 8,175,402 | B2 | * | 5/2012 | Funatsu et al. | 382/245 |

* cited by examiner

*Primary Examiner* — Hiep Nguyen
(74) *Attorney, Agent, or Firm* — Christie, Parker & Hale, LLP

(57) ABSTRACT

A method of duplicating electronically stored data that includes coupling a duplicating device between an original information storage device and a destination storage device, and streaming data from the original information storage device to the duplicating device. An embodiment of the method also includes segmenting the streaming data, determining a length of an uncompressed data segment, and calculating a length of the data segment when compressed. This embodiment further includes determining if the length of the data segment when compressed is less than some threshold, and copying a compressed data segment to the destination storage device if the length of the compressed data segment is less than the threshold, otherwise copying the uncompressed data segment to the destination storage device.

33 Claims, 3 Drawing Sheets

SYSTEM AND METHOD FOR DUPLICATING ELECTRONICALLY STORED DATA

FIELD OF THE INVENTION

This invention generally relates to computer forensics, and, more specifically, to systems and methods for improving the performance of computer forensic devices.

BACKGROUND OF THE INVENTION

In the field of computer forensics, forensics practitioners generally begin by identifying a collection of evidence stored in one or more digital formats. This collection of evidence may be stored on one or more digital storage devices, such as computer hard disks, flash memory cards, digital cameras, multimedia players, etc. In some of these cases, the original information storage device, for example one or more types of the above-mentioned digital storage devices, has been seized by law enforcement authorities and made available for data acquisition.

Typically, after identifying the subject storage devices related to the collection of evidence, the forensics practitioner makes duplicate copies of the data stored on the subject devices by placing the duplicated data on a new destination set of storage devices, possibly different in nature from the original storage device. This process is termed the acquisition phase. Because the subject storage devices are often read and copied sequentially from beginning to end, the acquisition phase may involve the transfer of large quantities of data. As such, the acquisition phase typically requires hardware having a high sequential data throughput. Consequently, forensics practitioners often use specialized computer hardware to perform acquisitions. This specialized computer hardware may also be used with data compression algorithms to facilitate the data acquisition and reduce the amount of memory needed for storage on the destination storage device.

Data compression has become fairly commonplace among computer users, and there are a variety of different data compression algorithms. One particular type of data compression algorithm, lossless data compression, allows the exact original data to be reconstructed from the compressed data. But, for any lossless data compression algorithm, there is a possibility that the data compression process will actually expand a given block of data rather than compress it.

In a computer forensics application, to make the most efficient use of electronic memory in the destination storage device, it is then advantageous to selectively compress only those portions, or blocks, of data that can be reduced in size by the compression algorithm. When a particular block of data expands, rather than contracts, after being subjected to the compression process, it is more efficient to simply copy the original data to the destination storage device unchanged. However, to make such a determination while maintaining the requisite high sequential data throughput, the specialized forensics device must be capable of quickly comparing the memory needed for both the compressed and the original representations of the given block of data, and copying the version requiring the least memory to the destination storage device.

It would therefore be desirable to have a system and method for quickly and accurately determining whether the data compression process will produce an expanded or compressed version of the original data, before the data is saved to the destination storage device. Embodiments of the invention provide such a system and method. These and other advantages of the invention, as well as additional inventive features, will be apparent from the description of the invention provided herein.

BRIEF SUMMARY OF THE INVENTION

In one aspect, embodiments of the invention provide a method of duplicating electronically stored data that includes coupling a duplicating device between an original information storage device and a destination storage device, and streaming data from the original information storage device to the duplicating device. An embodiment of the method also includes segmenting the streaming data, determining a length of an uncompressed data segment, and calculating a length of the same data segment when compressed. This embodiment further includes determining if the length of the compressed data segment is less than some threshold, and copying the compressed data segment to the destination storage device if the length of the compressed data segment is less than the threshold, otherwise copying the uncompressed data segment to the destination storage device.

In another aspect, embodiments of the invention provide a system for duplicating electronically stored data, the system having an input device configured to receive a data stream from an original information storage device, a byte counting device configured to determine the length of a segment of the data stream, when the segment is uncompressed, and a compression look-ahead device configured to calculate the length of the segment of the data stream, when the segment is compressed. An embodiment of the system also includes a data output device configured to write the uncompressed segment of the data stream and the compressed segment of the data stream to a destination storage medium.

Other aspects, objectives and advantages of the invention will become more apparent from the following detailed description when taken in conjunction with the accompanying drawings.

BRIEF DESCRIPTION OF THE DRAWINGS

The accompanying drawings incorporated in and forming a part of the specification illustrate several aspects of the present invention and, together with the description, serve to explain the principles of the invention. In the drawings.

While the invention will be described in connection with certain preferred embodiments, there is no intent to limit it to those embodiments. On the contrary, the intent is to cover all alternatives, modifications and equivalents as included within the spirit and scope of the invention as defined by the appended claims.

DETAILED DESCRIPTION OF THE INVENTION

As stated above, in a typical computer forensics case the computer forensics practitioner is tasked with copying data from an original information storage device to a destination storage device. One way to accomplish this task is to couple a duplicator between the original information storage device and the destination device. A duplicator is a device used to transfer a copy of the data on an original information storage device to a destination storage device. The duplicator may be configured to compress the data during the transfer, and, further, may be embodied in a field-programmable gate array (FPGA) device with high sequential data throughput. In an embodiment of the invention, a duplicator is configured to determine how much memory a given portion of data from the original information storage device will use in its original form versus the amount of memory it will use when the portion of data is compressed. The duplicator will then copy the data to the destination storage device in the form that uses the least memory. The technique for making this determination and copying data efficiently to memory is known as look-ahead compression. An embodiment of the present invention teaches a system and method for implementing look-ahead compression, which, in at least one embodiment, is implemented using a duplicator that includes an FPGA.

Figure 1:
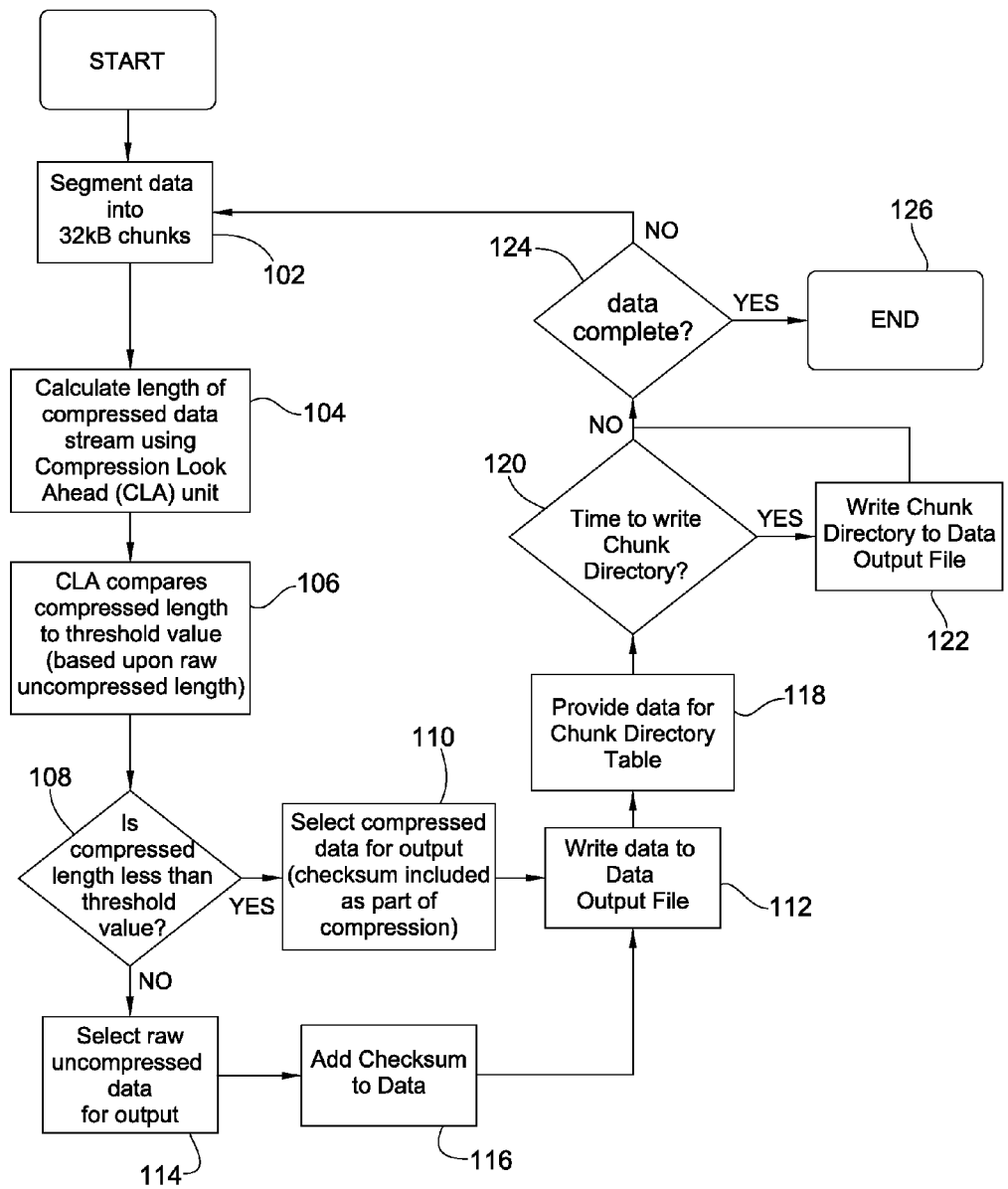
FIG. 1 is a flowchart illustrating a method of employing look-ahead compression, according to an embodiment of the invention.

FIG. 1 is a flowchart that includes the steps for a method of performing look-ahead compression. The first step of the method involves segmenting the data 102 into 32 kilobyte (kB) data blocks, or chunks. However, the data stream could be segmented into data chunks of any size the hardware is configured to manage. In at least one embodiment, this function is carried out by using some type of byte counter at the input of the duplicator. The data remaining at the end of a data stream may be less than 32 kB. Each chunk of data is treated independently of every other chunk. In an embodiment of the invention, data is presented in a continuous stream to an input device, which includes a byte counter and an input gate. From this input device, the segmented data stream is fed into a register, for example a bulk first-in first-out (FIFO) register, in the duplicator.

The second step of the method involves calculating the length of the compressed data chunk 104. As each new chunk of the data stream is presented, the length of the data stream, in compressed form, is calculated 104. In an embodiment of the invention, this function is carried out by a compression look-ahead (CLA) unit. The CLA unit is configured to process data segments of a predetermined byte length, then calculate the length of the compressed data segment, or chunk. In an embodiment, the CLA unit processes a maximum of 32 kB before performing a length comparison between the compressed and uncompressed data chunks. To allow for the compression of data in real time, the duplicator, in this embodiment, implements compression logic at both the front and back ends of the bulk FIFO register. Once the complete chunk of data has entered the FIFO register, the total length of the compressed data chunk is known.

Following the length calculation, a comparison of the compressed and uncompressed lengths 106 is performed. Once the CLA has performed this comparison 106, the result is placed in another register, for example, a CLA-result register. If the compressed length of the data chunk is less than a predetermined threshold 108, then the logic at the back end of the bulk FIFO register will pass the data chunk through the second compression function and select the compressed data for output to a data output file 110. In at least one embodiment, a checksum is included in the compressed data chunk. Then, the compressed data chunk is written to a data output file 112, which, in at least one embodiment is stored in a data output FIFO register. Typically, data written to the data output FIFO register is then written to a destination storage device. If the compressed length of the data chunk is greater than the predetermined threshold 108, then the logic at the back end of the bulk FIFO will select the raw, uncompressed data chunk for output to the data output file 114. In the embodiment of FIG. 1, a checksum is added 116 to the uncompressed data chunk before it is written to the data output file 112.

Each time a data chunk is written to the data output file 112, information on the data chunk is provided to a chunk directory table 118. After chunk data is written to the data output file 112 some predetermined number of times 120, the contents of the chunk directory table are written to the data output file 122. In an embodiment of the invention, the chunk directory table includes the byte offsets within the file for each of the preceding chunks, and also includes a flag that indicates whether each chunk has been written in a compressed or uncompressed format. A determination is made 124 as to whether the most recent data chunk written to the data output file is the last data chunk on the original information storage device. If so, the process is complete and, therefore, ends 126. If not, the process is repeated for the next data chunk presented to the bulk FIFO register.

Figure 2:
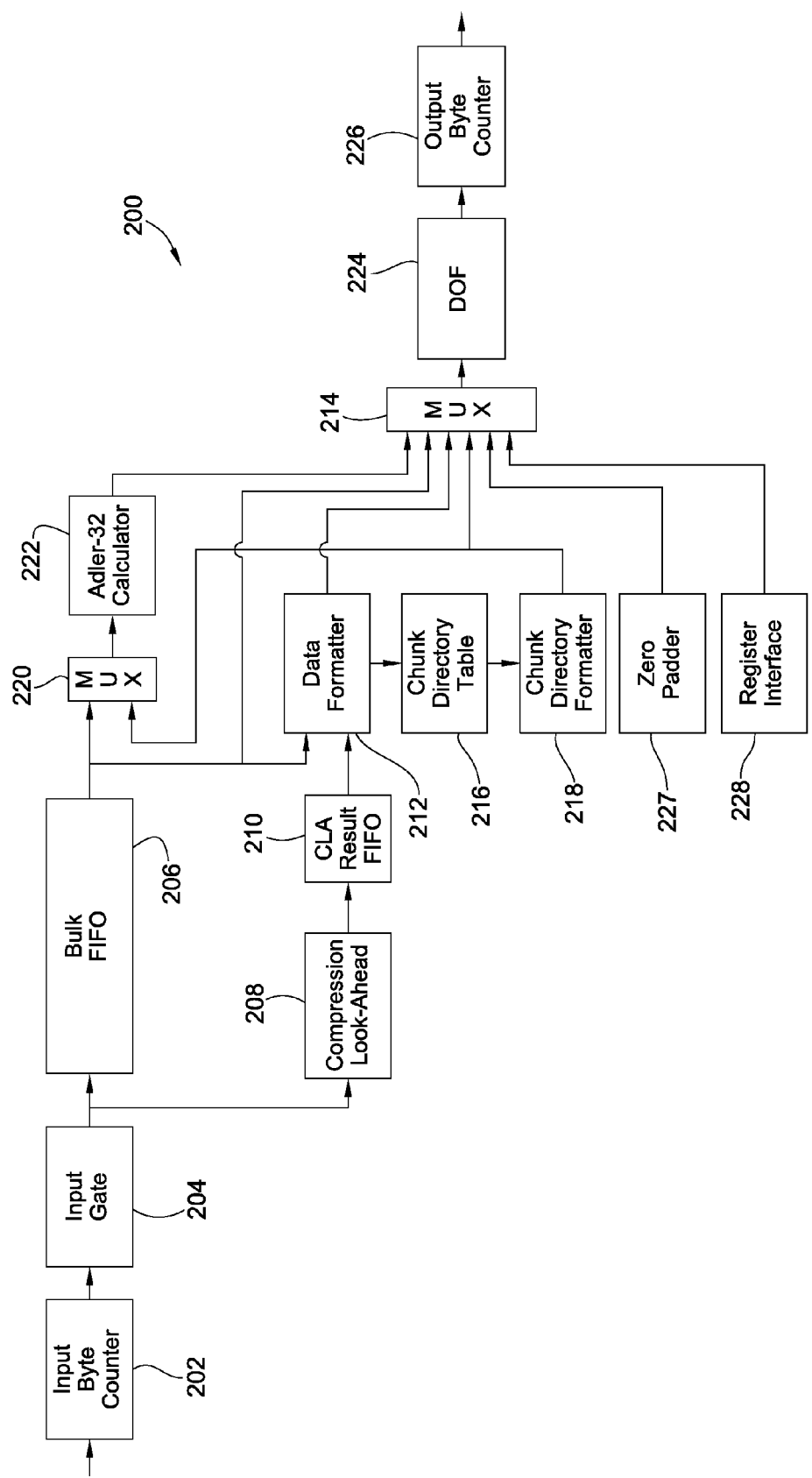
FIG. 2 is a block diagram for a system configured to implement a look-ahead compression process, according to an embodiment of the invention.

FIG. 2 is a block diagram of a system 200 for use in a data duplicating apparatus, the system configured to implement look-ahead compression, according to an embodiment of the invention. The embodiment of FIG. 2 shows an example of FPGA-based hardware configured to perform look-ahead compression of chunk data in accordance with the method described in FIG. 1. The system 200 includes, at the front end, an input byte counter 202 configured to receive the data stream from the original information storage device (not shown). The input byte counter 202 is coupled to a data input gate 204. In an embodiment of the invention, the input byte counter 202 counts the bytes of the incoming data stream so that the stream can be segmented into 32-kilobyte (kB) data chunks.

In at least one embodiment, the input byte counter 202 includes six 8-bit registers that, together, form a single 48-bit value, which indicates the number of source data bytes that have been accepted into the system 200. These registers are written to, and read from, by system software. Typically, the software will write to the registers at the beginning of data acquisition, and read from the registers to determine when the system 200 is finished accepting source input data. In this embodiment, the software is configured to acquire the number of sectors that have been read and routed to the system 200, and is able to calculate the number of input bytes that need to be processed to finish processing all of the input data.

Figure 3:
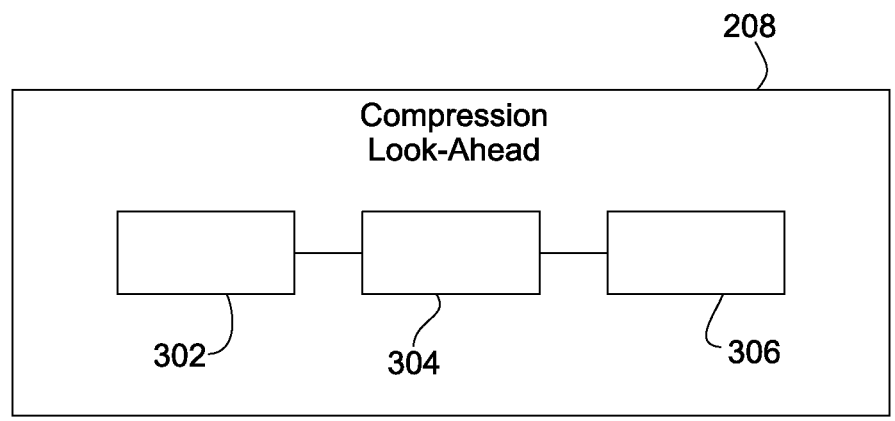
FIG. 3 is a block diagram of a compression look-ahead unit, according to an embodiment of the invention.

The data input gate 204 is coupled to a bulk FIFO register 206 and a compression look-ahead (CLA) unit 208. The CLA 208 calculates the compressed length of a given data segment, or chunk, as the chunk streams through the CLA unit 208, which is coupled to a CLA-result register 210. In an embodiment of the invention the CLA-result register 210 is a FIFO register. Further, in an embodiment of the invention shown in FIG. 3, the CLA unit 208 includes a run-length encoder (RLE) 302, a Huffman coder 304, and a byte counter 306. In this embodiment, the CLA unit 208 implements a subset of LZ77-based compression, wherein runs of three bytes or longer are compressed and all other data patterns are written as literal (uncompressed) symbols.

When the input byte counter 202 registers 32 kB of data, that data chunk is segmented from the rest of the data stream. At this point, the entire 32 kB chunk is in the bulk FIFO register 206, and the CLA unit 208 can determine the total compressed length of the data chunk. The CLA unit 208 compares the length of the compressed data chunk to a threshold values corresponding to the length of the raw, uncompressed 32 kB data chunk. The CLA unit 208 enters the results of the comparison into the CLA-result register 210. In an embodiment of the invention, the threshold value is a few bytes less than 32 kB. If the calculated length of the compressed 32 kB data chunk is less than the threshold value, the result is passed to the CLA-result register 210, which informs a data formatter 212 that the compressed data chunk is selected to be written to an output file register 224 via a first multiplexer 214. Otherwise, the raw, uncompressed data chunk is written to the output file register 224 via the first multiplexer 214.

Figure 4:
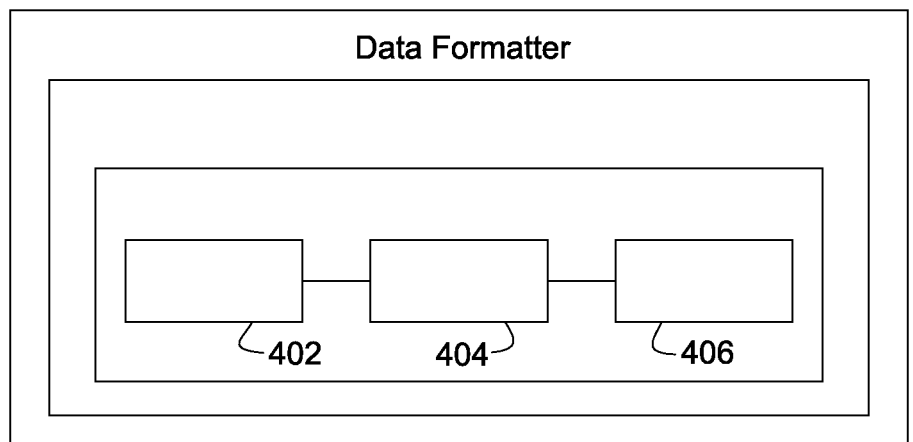
FIG. 4 is a block diagram of a data formatter, according to an embodiment of the invention.

Referring to FIG. 2, the outputs of the bulk FIFO register 206 and of the CLA-result register 210 are routed to the data formatter 212. The output of the bulk FIFO register 206 is also routed directly to the first multiplexer 214. In at least one embodiment, shown in FIG. 4, the data formatter 212 includes a run-length encoder (RLE) 402 coupled to a Huffman coder 404, which is, in turn, coupled to a bit packer 406.

As explained above, depending on the comparison results stored in the CLA-result register 210, either the data formatter 212 passes the compressed data chunk to the first multiplexer 214, or the bulk FIFO register 206 passes the raw, uncompressed 32 kB data chunk to the first multiplexer 214. However, the data formatter 212 is also configured to provide data to a chunk directory table register 216, which in turn, provides data to a chunk directory formatter 218. As alluded to above, in an embodiment of the invention, the chunk directory table register 216 includes the absolute byte addresses within the table for each data chunk, and also includes, for each data chunk, a flag that indicates whether each chunk was written in a compressed or uncompressed format. In at least one embodiment, the directory entry for each data chunk includes a 4-byte field, in which the lower 31 bits form an absolute byte address for the corresponding data chunk within the current output, or destination storage, file. The $32^{nd}$ bit is the flag that indicates whether the chunk is compressed or uncompressed. For redundancy, two copies of each chunk directory are typically transmitted to a data output file register 224, and subsequently to the destination storage device (not shown).

In an embodiment of the invention, the chunk directory table register 216 includes input pointer registers and output pointer registers. In a particular embodiment, the input pointer registers include two 8-bit registers. However, only 12 of the 16 available bits are used to form a single 12-bit value which indicates the entry offset within the chunk directory table that will receive the next compacted chunk directory entry. Similarly, the output pointer registers include two 8-bit registers, wherein only 12 of the 16 available bits are used to form a single 12-bit value. However, this 12-bit value indicates the entry offset within the chunk directory table of the next compressed chunk directory entry that will be accessed by the chunk directory formatter 218 for writing to the data output file register 224. In this embodiment, the value of the output pointer register is automatically advanced by the hardware as the chunk directory table is accessed for formatting until the value is equal to the value of the input pointer register.

An output of the chunk directory formatter 218 is routed to the first multiplexer 214, and to a second multiplexer 220. The second multiplexer 220 includes as inputs the output of the chunk directory formatter 218, and the output of the bulk FIFO register 206. The chunk directory formatter 218 is configured to re-format the contents of the chunk directory table register 216 when writing chunk directory data to the data output file register 224. The chunk directory table uses 32-bit entries, of which 31 bits constitute an absolute byte address pointer to the beginning of each chunk in the data output file register 224. However, in at least one embodiment, the chunk data formatter 218 is configured to use the current value of the base address as the pointer to the first data chunk, and to use byte offsets, determined by the lengths of the prior data chunks, to calculate the address pointers to subsequent data chunks. Because the length of each data chunk can be compacted, or provided in a 16-bit field, the chunk data formatter 218 is able to convey the same information as the 32-bit chunk directory table entries in a 17-bit field (i.e., the 16-bit length field plus the 1-bit compression/no compression flag). The optimization or compacting of the contents of the chunk directory table register 216 by the chunk directory formatter 218 allows the system 200 to substantially increase the number of times chunk data can be written the data output file register 224 before the contents of the chunk directory table register 216 must be written to the data output file register 224, thus reducing the total cycle time, and therefore increasing the efficiency of the data duplicating process. In an embodiment of the invention, the chunk data formatter 218 places the compacted chunk directory table entries in a memory device configure for temporary data storage, for example in a chunk directory table (CDT) memory device. When the data is written to the data output file register 224, the chunk directory formatter 218 reverses the process, essentially de-compacting the chunk directory table entry information on the fly as it writes the data to the data output file register 224.

In at least one embodiment, the data output file register 224 is a FIFO register, and also includes DOF byte count registers (not shown) and a DOF injection register (not shown). In an exemplary embodiment, the DOF byte count registers include two 8-bit registers, which form a single 16-bit value that indicates the number of bytes in the data output file register 224. The DOF byte count registers allow a system processor (not shown) to determine how much data can be safely written to the data output file register 224 without risk of overflow. In a particular embodiment, system software is configured to write data directly into the data output file register 224 by writing to the DOF injection register. The system software is configured to check to ensure the data output file register 224 is not full before writing to the data output file register 224 through the DOF injection register.

In an embodiment of the invention, the format of the output data file calls for the inclusion of data in addition to that being duplicated from the original information storage device. For example, in at least one embodiment, a preamble is required at the beginning of a data section and before each output by the chunk data formatter 218. This data is written to the DOF injection register by system software. Additionally, data may need to be written to the DOF injection register at the beginning of a disk sector when writing to a non-sector boundary on a disk in the destination storage device.

The output of the second multiplexer 220 is routed to a checksum calculator 222. In an embodiment of the invention, the checksum calculator 222 is an Adler-32 checksum calculator. Further, in at least one embodiment, the output file format calls for the inclusion of checksum data along with the chunk data. Thus, the checksum is appended to the uncompressed data segments, and the checksum is also included at the end of the compressed data as a requirement of the compression format. In at least one embodiment, the checksum calculator 222 includes four 8-bit registers, which, together, form a 32-bit value representing the current state of the checksum calculator. The value is updated by hardware as data is formatted by the data formatter 212, and as table entries are formatted by the chunk directory formatter 218.

When the second multiplexer 220 passes the output from the chunk directory formatter 218 to the Adler-32 checksum calculator 222, a checksum is calculated for the compressed data chunk from the data formatter 212. When the second multiplexer 220 passes the output from the bulk FIFO register 206 to the Adler-32 checksum calculator 222, a checksum is calculated for the raw, uncompressed data chunk from the bulk FIFO register 206. In at least one embodiment, the byte order of the checksum is different for compressed and uncompressed chunks.

An output byte counter 226 receives as input the output of the data output file register 224. The output byte counter 226 allows the system processor (not shown) to keep track of the accumulated size of a total amount of output data. In at least one embodiment, the output byte counter 226 includes six 8-bit registers, which, together, form a single 48-bit value representing a relative byte address within the current segment file of the data being generated by the system 200.

A zero padder 227 is coupled to the first multiplexer 214. The zero padder is optionally enabled to flood the data output file register 224 with a quantity of zeroes. This function is used when logic beyond the output byte counter 226 requires a minimum quantity of bytes to complete a given function. The zero padder 227 supplies the extra bytes as zeroes so that the minimum quantity is satisfied. The zero padder 227 is used when the value of these bytes is not critical.

A register file interface 228 is coupled to the first multiplexer 214. The register file interface 228 provides a bridge between the system processor (not shown) and the system 200. To provide this bridge, the register file interface 228 translates the asynchronous bus cycles of the system processor into synchronous communication signals suitable for controlling the system 200. The register file interface 228 also presents the status of the system 200 in a format suitable for the system processor to read.

In at least one embodiment of the invention, the method for duplicating electronically stored data described herein is carried out by the system software referred to above. Further, in some embodiments, the system software may be stored on a computer-readable storage medium. For example, a duplicator may be operated using software-based instructions stored on the computer-readable storage medium. Such storage mediums may include, but are not limited to, magnetic disk drives, optical disk drives including DVDs or CDs, flash memory drives, EEPROMS, semiconductor memory, and magnetic tape.

All references, including publications, patent applications, and patents cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method for duplicating electronically stored data comprising:
    coupling a duplicating device between a source information storage device and a destination storage device;
    streaming data from the source information storage device to the duplicating device;
    segmenting the streaming data;
    determining a length of an uncompressed data segment;
    calculating a length of the corresponding data segment when compressed;
    determining if the length of the compressed data segment is less than a threshold; and
    copying the compressed data segment to an output file register if the length of the compressed data segment is less than the threshold, otherwise copying the uncompressed data segment to the output file register.

2. The method of claim 1, further comprising creating a directory that includes information on each data segment, wherein the information includes an absolute byte address for the corresponding data segment in the output file, and wherein the information is compacted and stored in a memory device.

3. The method of claim 2, further comprising copying data from the directory to the output file register.

4. The method of claim 3, wherein copying data from the directory to the output file register comprises formatting the directory data before writing it to the output file register.

5. The method of claim 4, wherein formatting the directory data comprises decompacting the directory data for a particular data segment by substituting an absolute byte address for a byte offset from a base address in the directory information, wherein the byte offset is determined by the lengths of data segments prior to the particular data segment.

6. The method of claim 1, wherein segmenting the streaming data comprises segmenting the streaming data into segments of a predetermined length.

7. The method of claim of claim 6, wherein segmenting the streaming data into segments of a predetermined length comprises segmenting the streaming data into segments of approximately 32 kilobytes.

8. The method of claim 1, wherein calculating the length of a compressed segment comprises applying a subset of an LZ77-based compression algorithm to the data stream, then counting the number of bytes in the data stream after application of the compression algorithm.

9. The method of claim 1, wherein determining if the length of the data segment when compressed is less than the threshold comprises determining if the length of the data segment when compressed is less than a threshold that is less than the length of the uncompressed segment.

10. The method of claim 1, wherein streaming data from the source information storage device comprises streaming data from the source information storage device into a FIFO register.

11. The method of claim 1, further comprising writing contents of the output file register to the destination storage device.

12. The method of claim 11, further comprising calculating a checksum for each data segment copied to the destination storage device.

13. The method of claim 12, wherein calculating a checksum comprises calculating an Adler-32 checksum.

14. The method of claim 1, wherein copying compressed and uncompressed data segments to an output file register comprises copying compressed and uncompressed data segments to a FIFO register.

15. A system for duplicating electronically stored data, the system comprising:
   an input device configured to receive a data stream from a source information storage device;
   a byte counting device configured to determine a length of a segment of the data stream, when the segment is uncompressed;
   a compression look-ahead device configured to calculate the length of the segment of the data stream, when the segment is compressed; and
   a data output device configured to write the uncompressed segment of the data stream and the compressed segment of the data stream to a destination storage medium.

16. The system of claim 15, wherein the compression look-ahead device comprises:
   a run-length encoder;
   a Huffman coder coupled to the run-length encoder; and
   a byte counter coupled to the Huffman coder.

17. The system of claim 15, further comprising a bulk FIFO register to store portions of the segment of the data stream.

18. The system of claim 15, further comprising a compression look-ahead result register coupled to the compression look-ahead unit, and configured to store a result of a comparison between the length of the uncompressed data segment and the length of the compressed data segment.

19. The system of claim 15, further comprising a checksum calculator configured to add a checksum to a segment of the uncompressed data stream and to a segment of the compressed data stream.

20. The system of claim 19, wherein the checksum calculator comprises an Adler-32 checksum calculator.

21. The system of claim 15, wherein the data output device comprises a FIFO register.

22. The system of claim 15, further comprising a directory register configured to store data for each segment of the data stream in a directory table.

23. The system of claim 22, further comprising a directory formatter configured to format data from the directory register for storage in the data output device.

24. The system of claim 23, wherein the directory formatter is further configured to compact data from the directory register before storing the data in a storage device configured for temporary data storage.

25. The system of claim 15, further comprising a data formatter configured to format data from the bulk FIFO register and from the compression look-ahead device for storage in the data output device.

26. The system of claim 15, further comprising an output byte counter configured to count the total number of bytes in the data stream written to the destination storage device.

27. A non-transitory machine-readable storage medium having program instructions thereon which when executed by a processor cause the processor to perform the step of:
   operating an electronic data duplicating system, wherein operating the electronic data duplicating system comprises:
   partitioning streaming data from a source information storage device to a destination storage device into discrete data segments;
   determining a length of an uncompressed data segment;
   calculating a length of the corresponding data segment when compressed;
   determining if the length of the compressed data segment is less than a threshold; and
   copying the compressed data segment to an output file register if the length of the compressed data segment is less than the threshold, otherwise copying the uncompressed data segment to the output file register.

28. The non-transitory machine-readable storage medium of claim 27, wherein operating an electronic data duplicating system further comprises creating a directory that includes information on each data segment, wherein the information includes an absolute byte address for the corresponding data segment in the output file.

29. The non-transitory machine-readable storage medium of claim 28, wherein operating an electronic data duplicating system further comprises copying data from the directory to the output file register.

30. The non-transitory machine-readable storage medium of claim 29, wherein copying data from the directory to the output file register comprises formatting the directory data before writing it to the output file register.

31. The non-transitory machine-readable storage medium of claim 30, wherein formatting the directory data comprises de-compacting the directory data for a particular data segment by substituting an absolute byte address for a byte offset from a base address in the directory information, wherein the byte offset is determined by the lengths of data segments prior to the particular data segment.

32. The non-transitory machine-readable storage medium of claim 27, wherein operating an electronic data duplicating system further comprises writing the contents of the output file register to the destination storage device.

33. The non-transitory machine-readable storage medium of claim 32, wherein operating an electronic data duplicating system further comprises calculating a checksum for each data segment copied to the destination storage device.

* * * * *